(12) United States Patent
Atallah et al.

(10) Patent No.: US 6,735,145 B1
(45) Date of Patent: May 11, 2004

(54) METHOD AND CIRCUIT FOR OPTIMIZING POWER CONSUMPTION AND PERFORMANCE OF DRIVER CIRCUITS

(75) Inventors: Francois Ibrahim Atallah, Raleigh, NC (US); Gregory Christopher Burda, Holly Springs, NC (US); Anthony Correale, Jr., Raleigh, NC (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 10/065,626

(22) Filed: Nov. 4, 2002

(51) Int. Cl.[7] .................................................. G11C 8/00
(52) U.S. Cl. ............................ 365/230.06; 365/189.11; 365/189.09
(58) Field of Search ........................ 365/230.06, 189.11, 365/189.09; 327/536

(56) References Cited

U.S. PATENT DOCUMENTS

| | | | |
|---|---|---|---|
| 5,255,224 A | 10/1993 | Galbi et al. ............. 365/189.09 |
| 5,307,315 A | 4/1994 | Oowaki et al. ......... 365/189.09 |
| 5,363,333 A | * 11/1994 | Tsujimoto .............. 365/189.09 |
| 5,373,479 A | 12/1994 | Noda ...................... 365/230.06 |
| 5,499,209 A | 3/1996 | Oowaki et al. ......... 365/189.11 |
| 5,818,790 A | 10/1998 | Kim et al. .............. 365/230.06 |
| 5,864,508 A | 1/1999 | Takashima et al. ..... 365/189.11 |
| 5,999,461 A | 12/1999 | Verhaeghe et al. ..... 365/189.11 |
| 6,025,751 A | 2/2000 | Chiang et al. .............. 327/589 |
| 6,094,378 A | 7/2000 | Zheng .................... 365/189.11 |
| 6,515,932 B1 | * 2/2003 | Kubo ...................... 365/230.06 |
| 6,580,654 B2 | * 6/2003 | Foss et al. .................. 365/226 |

* cited by examiner

*Primary Examiner*—Huan Hoang
(74) *Attorney, Agent, or Firm*—Scott W. Reid; Sawyer Law Group, LLP (57) ABSTRACT

A method and circuit for optimizing power consumption and performance of driver circuits are described. More particularly, embodiments of the present invention provide an enhanced driver circuit. The enhanced driver circuit provides a first voltage, and a detector coupled to the enhanced driver that monitors the first voltage. If the first voltage falls below a predetermined value, the enhanced driver increases the first voltage to at least an optimal voltage.

6 Claims, 6 Drawing Sheets

METHOD AND CIRCUIT FOR OPTIMIZING POWER CONSUMPTION AND PERFORMANCE OF DRIVER CIRCUITS

FIELD OF THE INVENTION

The present invention relates to driver circuits, and more particularly to a method and circuit for optimizing power consumption and performance of driver circuits.

BACKGROUND OF THE INVENTION

Low power requirements in a circuit often conflict with high performance requirements. As a result, the voltage ranges at which circuits can operate can be limited in order to address this conflict. For example, circuit configurations that are efficient with regard to power, performance, and area are limited in that they can operate at one voltage but often cannot operate properly at other voltages, e.g., lower voltages. Conversely, circuit configurations that are designed for broad voltage operations often do not exhibit optimal power, performance, and area characteristics.

A classic example of the trade off between low power requirements and high performance requirements is that of a register file. A register file often includes an array of memory elements. All memory elements within a bit slice are connected to one another through a multiplexor. Each memory element within a bit slice could include, for example, one or more pass gates, each associated with a different word line. The multiplexor is effectively distributed by incorporating the pass gates in each memory element and then coupling the pass gate outputs together within the bit slice.

Figure 1:
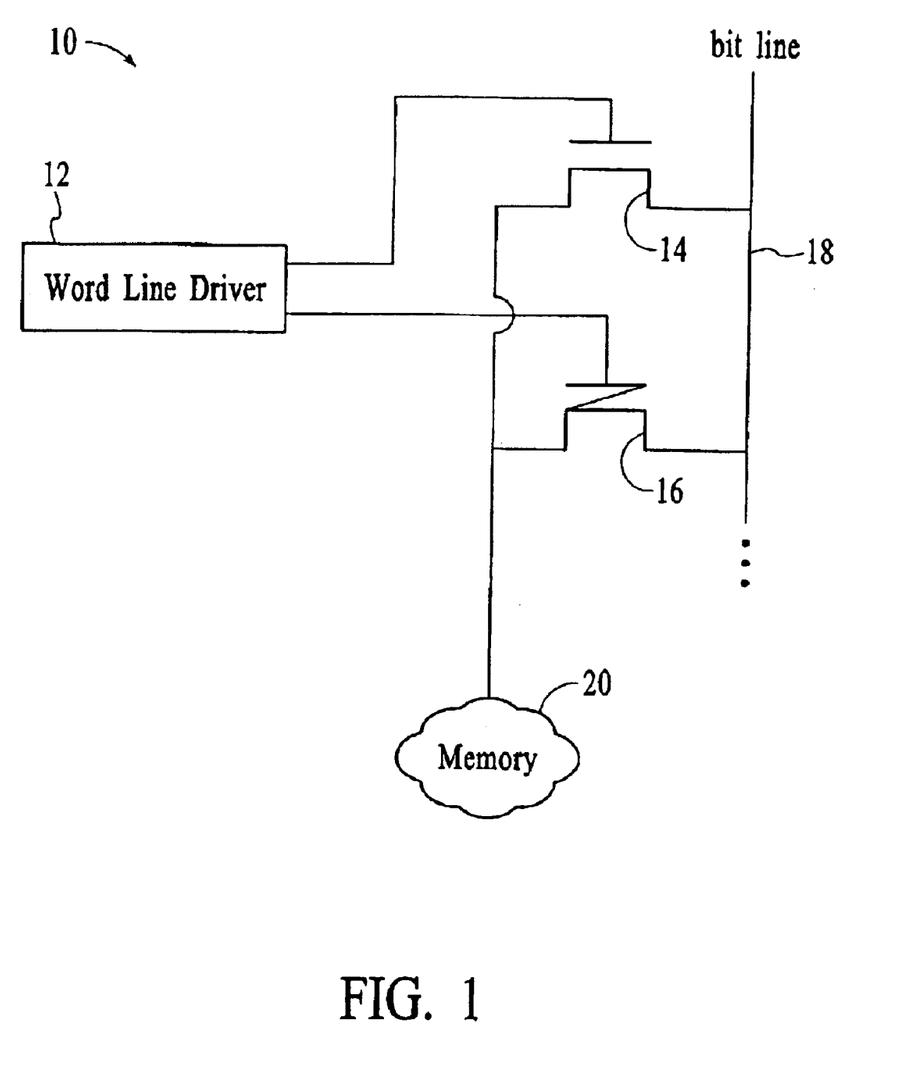
FIG. 1 is a block diagram of a conventional file register circuit using NFET transistors and PFET transistors.

FIG. 1 is a block diagram of a conventional file register circuit 10, which includes a conventional wordline driver 12, an NFET transistor 14, a PFET transistor 16, a bit line 18, and a memory 20. To compensate for the adverse effects of an NFET only configuration as described above, the PFET transistor 16 is placed in parallel with the NFET transistor 14 making a transmission gate. As described above, NFET transistors are known to pass good logical 0s but poor logical 1s. In contrast, PFET transistors are known to pass good logical 1s but a poor logical 0s. When an NFET transistor and a PFET transistor work in tandem, the result is the passing of good logical 1s and good logical 0s. Generally, the NFET transistor does the majority of the work. On an upswing (i.e., a logical 0 to a logical 1), the NFET transistor charges up a node quite quickly but only part way. The PFET transistor takes the node up the rest of the way resulting in a logical 1. Conversely, when trying to swing the signal in the other direction (i.e., a logical 1 to a logical 0), the NFET transistor does all the work. The PFET transistor helps but not significantly.

Problems with circuit configurations using an NFET/PFET (N/P) transistor pair configuration are as follows. First the area required increases, e.g., at least doubles, because of the area required by the complementary PFET transistors. Second, two different control signals are required. There is a positive active control signal to activate each NFET transistor and a negative active control signal to activate each PFET transistor. Furthermore, implementing the PFET transistors increases the power consumption. Third, the additional PFET transistors increase the power consumption.

An NFET only configuration is preferred for various applications, such as register files and memories, which generally have tight area and power constraints. NFET transistors enable the building of complex functions in a minimum amount of area. NFET transistors also use a minimum amount of power.

With regard to area, NFET only configurations require only one control line and one control line driver. If, for instance, PFET transistors were also used a second control line and a second control line driver would be required. Using only NFET transistors also reduces power and area because complement signals for the PFET transistors are not required. The bit line capacitance is also reduced, thereby reducing bit line power.

NFET only configurations have reduced bit line voltage swings resulting in lower bit line power. The bit line voltage swing is the power supply voltage (Vdd) minus the device's threshold voltage (Vt). The lower bit line power is due to the bit line power being directly proportional to the voltage squared. Hence, power and area are optimized using the NFET only configuration.

A problem with an NFET only configuration, however, is that NFET transistors are notorious for not passing good logical 1s. For example, with a logical 1 applied to its drain or source and a logical 1 of the same magnitude applied to its gate, the resulting output voltage at the other side of that pass transistor is a logical 1. However, it is a logical 1 that is at a reduced voltage. A circuit receiving this output voltage must be designed to handle the reduced voltage. The reduced voltage is the total gate voltage minus Vt.

As Vdd drops, the amount of gate overdrive (Vdd−Vt) is reduced. As Vdd drops and starts to get closer to Vt, the NFET transistor will not pass a sufficiently high output voltage to provide a logical 1. For example, if Vdd is 2.5V and Vt is 0.5V, the transistor's output voltage can be expected to be 2 volts. However, if Vdd is 1V and Vt is 0.4V, the transistor's output voltage can be expected to be only 0.6V. Accordingly, as Vdd continues to be reduced, the delta between Vdd and Vt becomes lower and lower.

Consider a bit line multiplexor that couples together the NFET transistors of a bit slice. Because the output of the bit line multiplexor is a function of both Vdd and the Vt of the NFET transistors, there is reduced headroom as Vdd is reduced. Hence, as Vdd is reduced, the operation of the circuit is compromised both by a rapid degradation in performance and even functional integrity. One solution is to utilize a bootstrap circuit with an NFET only configuration.

Figure 2:
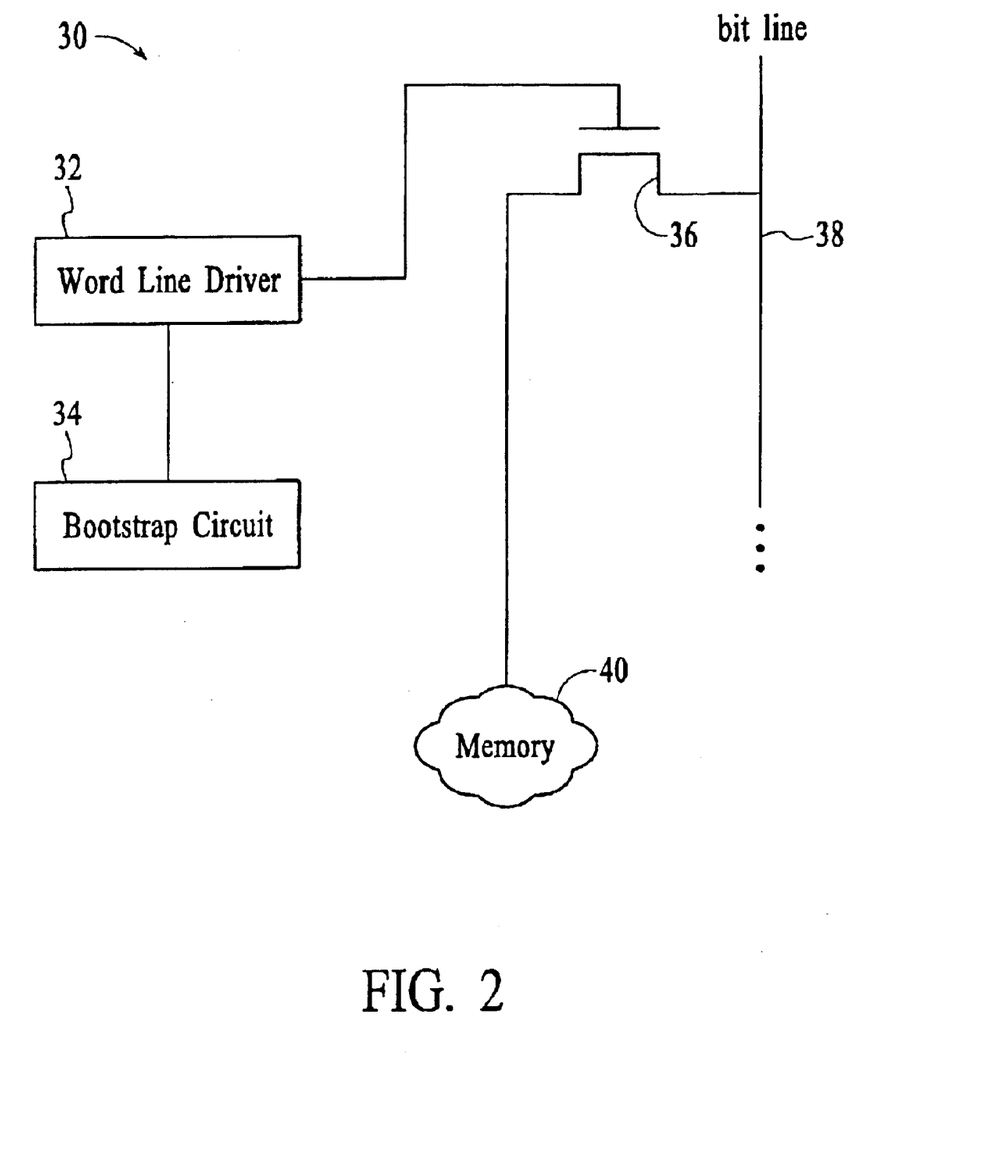
FIG. 2 is a block diagram of a conventional file register circuit using an NFET only configuration and a bootstrap circuit.

FIG. 2 is a block diagram of a conventional file register circuit 30, which includes a word line driver 32, a conventional bootstrap circuit 34, an NFET transistor 36, a bit line 38, and a memory 40. The conventional bootstrap circuit 34 enables the wordline driver to drive a higher voltage at the gate of the NFET transistor 36. If there is a higher voltage at the gate, the gate voltage minus Vt is still substantially equal to Vdd.

A problem with the conventional bootstrap 34 circuit is that the voltages are elevated at the gate all the time in order to achieve higher performance. Accordingly, while the conventional bootstrap circuit 34 may address the problem of area, the conventional bootstrap circuit 34 does not address the problem of power consumption. As a result, such circuits consume excess power. Accordingly, the known solutions either consume too much power and area, under-perform, or operate within a narrow voltage range.

Accordingly, what is needed is a method and circuit for optimizing the power consumption and performance of driver circuits. The method and system should provide a driver circuit that enables other circuits to operate over broad voltage ranges without compromising power consumption and performance. The present invention addresses such a need.

SUMMARY OF INVENTION

An enhanced driver circuit is disclosed. Embodiments of the present invention include an enhanced driver that provides a first voltage. A detector coupled to the enhanced driver monitors the first voltage. If the first voltage falls below a predetermined value, the enhanced driver increases the first voltage to at least an optimal voltage.

In another aspect of the present invention, the enhanced driver includes a programmable bootstrap circuit that selectively provides a second voltage to replace the first voltage if the first voltage falls below the predetermined value. The value of the second voltage can be anywhere between the predetermined value and the original value of the first voltage, or higher.

According to the method and system disclosed herein, the embodiments of present invention provide a programmable bootstrap circuit. Consequently, an enhanced driver circuit is provided that increases the voltage range at which circuits driven by the enhanced driver circuit can operate without compromising the power consumption and performance of the enhanced driver circuit.

DETAILED DESCRIPTION

The present invention relates to driver circuits, and more particularly to a method and circuit for optimizing power consumption and performance of driver circuits. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Generally, the embodiments of the present invention improve circuit performance by enabling a circuit to operate over broad voltage ranges without compromising optimal power consumption or performance by implementing an enhanced driver circuit. The enhanced driver circuit employs a programmable bootstrap circuit that increases the enhanced driver circuit's output voltage but only under certain conditions, e.g., when Vdd drops below a predetermined value. To more particularly describe the present invention, refer now to the following discussion in conjunction with the associated figures.

Figure 3:
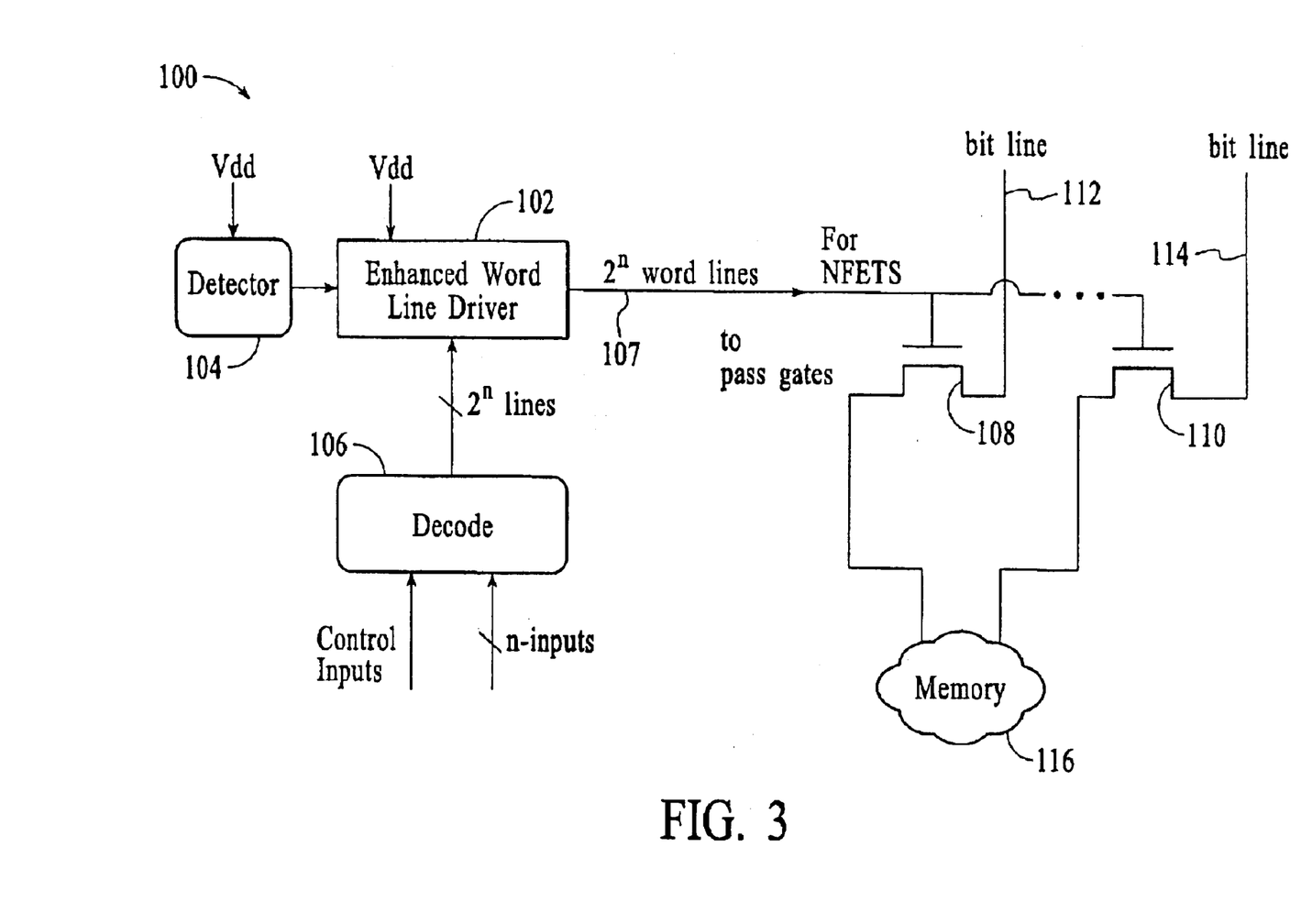
FIG. 3 is a block diagram of a circuit using an enhanced work line driver, in accordance with the present invention.

FIG. 3 is a block diagram of a circuit 100 using an enhanced word line driver 102, a detector 104, a decoder 106, a word line 107, NFET transistors 108 and 110, bit lines 112 and 114, and a memory 116. The detector 104 and the decoder 106 are coupled to the enhanced word line driver 102. The enhanced word line driver 102 is coupled to the word line 107. The word line 107 is coupled the NFET transistors 108 and 110, which is coupled to bit lines 112 and 114, and the memory 116.

Generally, in operation, the enhanced word line driver 102 drives the word line 107 so that data can be written to or read from the memory 116. Note that for illustrative purposes, only one word line is shown, and there can be multiple word lines, which can be selected. The NFET transistors 108 and 110 represent at least two pass gates of the word line 107. There can be more pass gates. When the NFET transistors 108 and 110 are turned on, data can pass between the memory 116 and the bit lines 112 and 114. The bit lines 112 can be coupled to write and read ports (not shown).

More specifically, to read and write data to the memory 116, the decoder 106 selects the word line 107 by sending an address signal to the enhanced word line driver 102. The decoder 106 determines which word of n words to be selected. The enhanced word line driver 102 then outputs a word line signal to the memory 116 by driving the word line 107, and more specifically, the gates of the NFET transistors 108 and 110.

The detector 104 monitors Vdd and provides a signal to the enhanced word line driver 102 if Vdd drops below a predetermined value. The specific predetermined value will depend on the specific application and design requirements. For example, the predetermined value can be the minimum operating voltage. The predetermined value can also be some voltage greater than the minimum operating voltage, the original Vdd voltage, or greater than the original Vdd voltage. When Vdd drops below the predetermined value, the enhanced word line driver 102 then increases its output voltage to an optimal voltage.

The detector 104 can be implemented with various well-known detectors such as Vdd detectors, process detectors, etc. An algorithm within the detector 104 is used to compare the value of Vdd to the predetermined value.

Note that although the present invention disclosed herein is described in the context of a register file, the present invention also applies to other applications using driver circuits. In other words, the present invention is not limited to register files and may apply to other circuits and still remain within the spirit and scope of the present invention.

Figure 4:
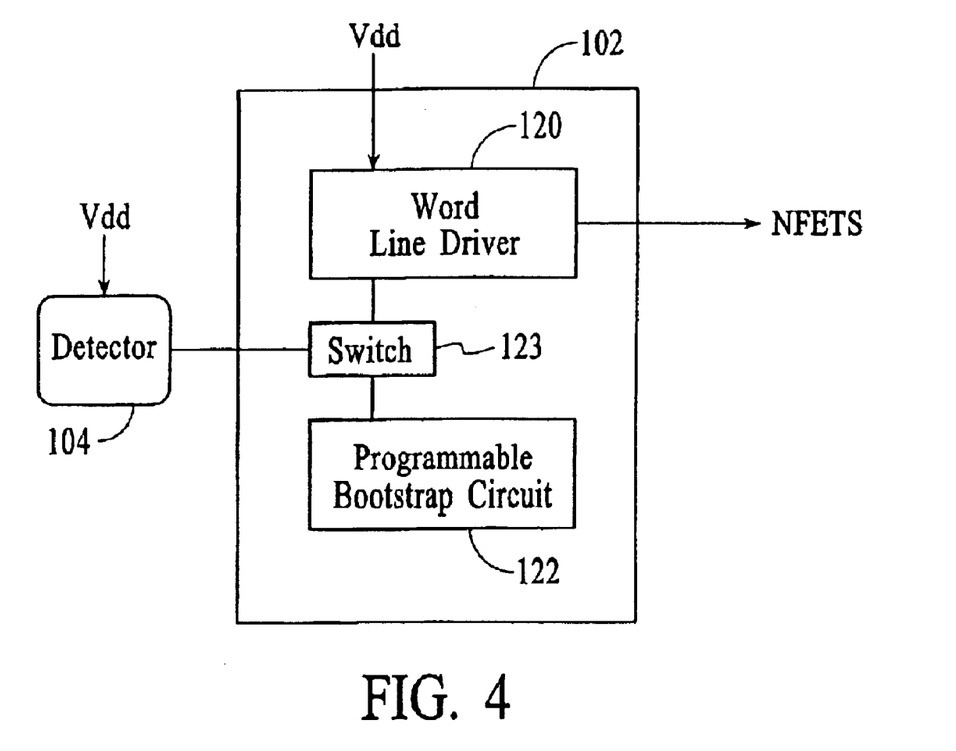
FIG. 4 is a block diagram of the enhanced word line driver of FIG. 3, in accordance with the present invention.

FIG. 4 is a block diagram of the enhanced word line driver 102 of FIG. 3 coupled to the detector 104, in accordance with the present invention. Referring to FIG. 4, the enhanced word line driver includes a word line driver 120, a programmable bootstrap circuit 122, and a switch 123. The detector 104 is coupled to the switch 123, which is coupled to the word line driver 120 and to the programmable bootstrap circuit 122.

In operation, if Vdd has not dropped below the predetermined value, the word line driver 120 outputs a voltage substantially equal to Vdd. Accordingly, under this condition the programmable bootstrap circuit 122 does not elevate the output voltage of the word line driver 120.

When the detector 104 detects that Vdd has dropped below a predetermined value, the detector 104 sends a signal to the switch 123. The switch 123 then causes the word line driver 120 to output a voltage provided by the programmable bootstrap circuit 122. As a result, the word line driver 120 outputs an optimal voltage.

Again, as described above, the optimal voltage can be the original Vdd value, or some other value typically higher than the predetermined value. Specifically, in a specific embodiment, the output range is set at zero volts to Vdd volts when Vdd is above a predetermined value and boosted to some value, e.g., above Vdd, when Vdd is below the predetermined value. Again, the actual higher voltage will depend on the specific application. For example, the higher voltage can be the original Vdd value. It can be Vdd+Vt. It can be 2*Vdd, or some other value.f The flexibility provided by the enhanced word line driver 102 enables circuits driven by the enhanced word line driver 102 to operate over broad voltage ranges. For example, if an application requires a circuit to run it at 2V and Vdd can supply the required 2V, no increase is required. However, if the same enhanced word line driver is applied in a different application, such as a low-power application, e.g., a personal data device, the enhanced word line driver ensures the circuits driven by the enhanced word line driver operate properly at the appropriate voltage levels.

The programmable bootstrap circuit 122 provides an alternative power supply to the word line driver 120 in place of Vdd when Vdd drops to the predetermined value. The voltage that the programmable bootstrap circuit 122 outputs to the word line driver 120 is a function of Vdd in that the programmable bootstrap circuit 122 is activated depending on the Vdd voltage level. Unlike the prior art solution where the bootstrap circuit is always on, the programmable bootstrap circuit 122 is on only under certain conditions thereby optimizing power and performance. Hence, the Vdd-Vt bit line voltage will prevail when Vdd is high and will prevail when a lower Vdd voltage is applied.

In a specific embodiment, the programmable bootstrap circuit 122 can derive its output voltage from the Vdd power supply. As such, the programmable bootstrap circuit 122 can, for example, amplify the voltage provided by the Vdd power supply to an optimal voltage. In another specific embodiment, a separate power supply can be used to drive the programmable bootstrap circuit 122. The specific power supply configuration will of course depend on the specific application.

Another benefit of the present invention is that no excessive voltage can stress the transistors driven by the enhanced word line driver. Another benefit of the present invention is that the smaller, more area efficient configuration for the memory 116 (FIG. 3) and an integrated multiplexor (not shown) for the bit lines can be employed regardless of the Vdd operating conditions. Still referring to FIG. 3, even though the detector 104 adds to the overall circuit, it does not add as much as adding more PFET transistors and associated lines and controls associated with such PFET transistors. According to embodiments of the present invention, power is optimized because the bit line capacitance is minimal under all voltage conditions.

Embodiments of the present invention allows for a single physical and logical realization to address both low-power applications and high performance applications. This is especially important in embedded applications where a single core function, such as a microprocessor, is expected to be used in a wide range of applications.

Figure 5:
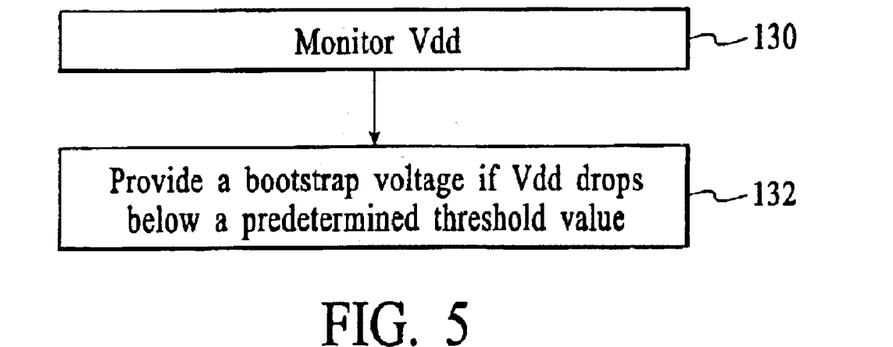
FIG. 5 is a flow chart showing the operation of the circuit of FIG. 3, in accordance with the present invention.

FIG. 5 is a flow chart showing the operation of the circuit 100 of FIG. 3. In step 130, a detector monitors Vdd to determine if Vdd falls below a predetermined value. In step 132, the enhanced world line driver provides a bootstrapped voltage if Vdd falls below the predetermined value.

Figure 6:
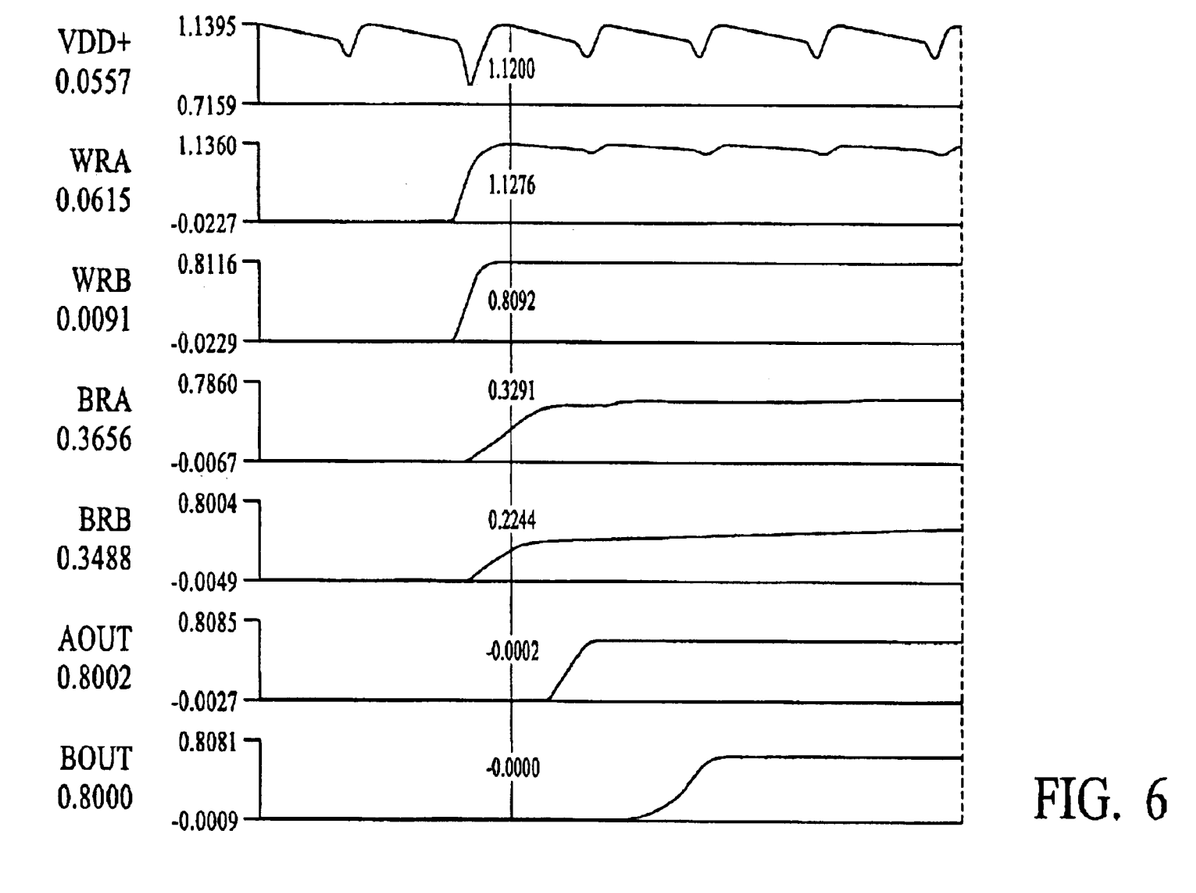
FIG. 6 is a graph showing a comparison between a word line signal associated with the enhanced word line driver of FIG. 3 versus a word line signal without the enhanced word line driver.

FIG. 6 is a graph showing a comparison between a word line signal associated with the enhanced word line driver 102 of FIG. 3 versus a word line signal without the enhanced word line driver 102. Referring to both FIGS. 3 and 6, Vdd+ is the bootstrapped voltage. WRA is a word line signal associated with the enhanced word line driver (i.e., driven by Vdd+). WRB is a word line without the bootstrapped voltage. BRA is a bit line associated with WRA. BRB is a bit line associated with WRB. AOUT is the output from BRA. BOUT is the output from BRB.

Note the raised voltage on the WRA (1.127V versus 0.8V) and BRA (0.329V versus 0.224V) nodes for an applied Vdd=0.8V. This directly correlates to a better performance on the AOUT relative to BOUT.

Figure 7:
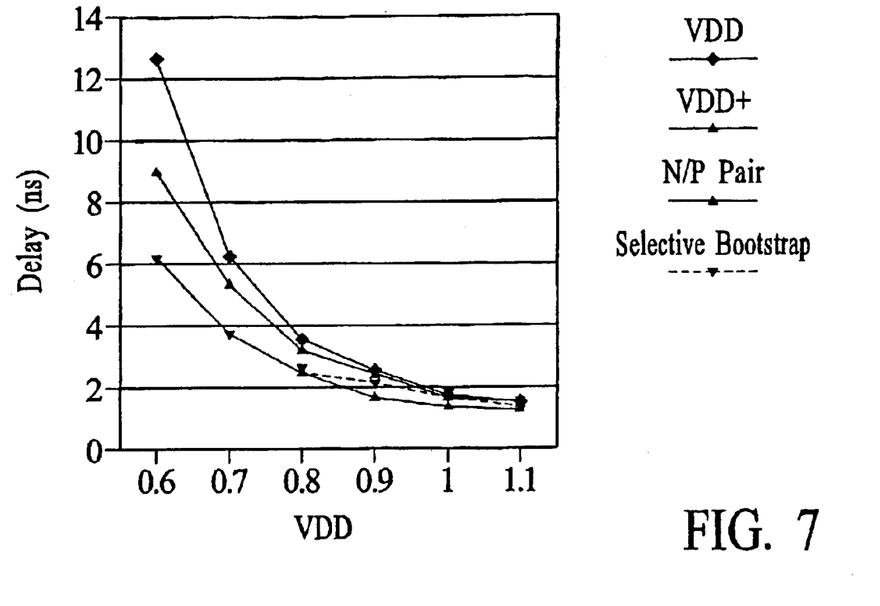
FIG. 7 is a graph showing a comparison of the performance of a regular word line versus the performance of a bootstrapped word line.

FIG. 7 is a graph showing a comparison of the performance of a regular word line versus the performance of a bootstrapped word line. FIG. 7 illustrates one of many benefits of a device that utilizes a system and method in accordance with the spirit and scope of the present invention. At a Vdd value of 0.9V, the delay of the N/P transistor pair and the non-bootstrapped solution are about the same. At values where Vdd is less than 0.9V, the performance of the non-bootstrapped NFET solution begins to degrade at a faster rate than that of its N/P transistor pair counterpart. The integration of the bootstrapped word line at this point would move the operation to the Vdd+ curve, which exhibits the best power-performance. This is illustrated by the dashed curve.

Figure 8:
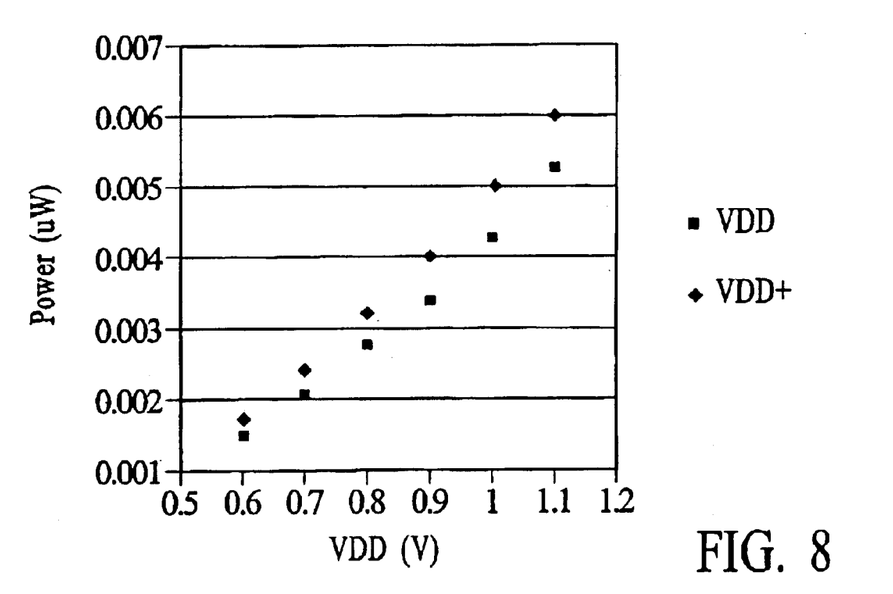
FIG. 8 is a graph showing a comparison of the power consumption of a regular word line versus the power consumption of a bootstrapped word line.

FIG. 8 is a graph showing a comparison of the power consumption of a regular word line versus the power consumption of a bootstrapped word line. The graph is in the context of an NFET only register file implementation. The two curves represent a regular word line (Vdd) and a bootstrapped word line (Vdd+). Note that the power values shown are irrelevant due to the simulation being performed on a cross section of the register file. While the power for the N/P transistor pair configuration is not shown, it is known to be much higher than that of the NFET only configuration.

Using the same Vdd detection limit of 0.9V as was used to illustrate the delay in FIG. 7 for engagement of the programmable bootstrap circuit 122, one can see that the power dissipation of this configuration will follow Vdd for Vdd values of 1.2V to 0.9V and then rise up and follow the green curve associated with the bootstrap approach (Vdd+).

One of ordinary skill in the art will readily recognize that there could be variations to the embodiments and those variations would be within the spirit and scope of the present invention. For example, in a specific embodiment, an override signal can be provided to a circuit utilizing the enhanced word line driver 102 (FIG. 4) to activate the bootstrap circuit 122 at all voltage conditions. Hence, power can be sacrificed for performance. This specific embodiment is useful for higher performance applications and for performance sorting applications.

Furthermore, while the static register file was illustrated above, this technique can be applied to any pass gate configuration. A case in point is a typical multiplexor whose gate inputs are driven by a decoder. The decoder can be enhanced to employ this power supply voltage sensing bootstrap configuration. Similarly, latches that employ NFET only pass gates can be used over broad power supply ranges. The associated clock drivers/splitters can be enhanced to employ embodiments of the present invention to enable operation over broad power supply ranges.

According to the method and system disclosed herein, the present invention provides numerous benefits. For example, it provides a programmable bootstrap circuit. Consequently, an enhanced driver circuit is provided that increases the voltage range at which circuits driven by the enhanced driver circuit can operate without compromising the power consumption and performance of the enhanced driver circuit.t Although he present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A circuit comprising:

a word line driver that provides a first voltage;

a switch coupled to the word line driver;

a detector coupled to the switch; and a programmable bootstrap circuit coupled to the switch, wherein the detector monitors the first voltage, and wherein if the first voltage falls below a predetermined value, the switch causes the word line driver to output an optimal voltage provided by the programmable bootstrap circuit.

2. The circuit of claim 1 wherein the optimal voltage is at least a minimum operating voltage.

3. The circuit of claim 1 wherein the optimal voltage is greater than a minimum operating voltage.

4. The circuit of claim 1 further comprising a decoder coupled to the word line driver.

5. The circuit of claim 1 wherein an override signal can be applied so that the optimal voltage overrides the first voltage as long as the override signal is applied.

6. A method for providing a circuit for optimizing power consumption and performance of a driver circuit, the method comprising the steps of:

(a) providing a first voltage with a word line driver;

(b) detecting the first voltage; and (c) providing a switch coupled to the word line driver and to a programmable bootstrap circuit, wherein if the first voltage falls below a predetermined value, the switch causes the word line driver to output an optimal voltage provided by the programmable bootstrap circuit.

* * * * *